United States Patent
Zaia et al.

(10) Patent No.: US 10,522,732 B2
(45) Date of Patent: Dec. 31, 2019

(54) THERMOELECTRIC POLYMER AEROGELS AND METHODS OF FABRICATION THEREOF

(71) Applicants: Edmond W. Zaia, Berkeley, CA (US); Madeleine P. Gordon, Berkeley, CA (US); Preston Zhou, Fremont, CA (US); Boris Russ, Berkeley, CA (US); Nelson Coates, Oakland, CA (US); Ayaskanta Sahu, Berkeley, CA (US); Jeffrey J. Urban, Emeryville, CA (US)

(72) Inventors: Edmond W. Zaia, Berkeley, CA (US); Madeleine P. Gordon, Berkeley, CA (US); Preston Zhou, Fremont, CA (US); Boris Russ, Berkeley, CA (US); Nelson Coates, Oakland, CA (US); Ayaskanta Sahu, Berkeley, CA (US); Jeffrey J. Urban, Emeryville, CA (US)

(73) Assignee: The Regents of the University of California, Oakland, CA (US)

( * ) Notice: Subject to any disclaimer, the term of this patent is extended or adjusted under 35 U.S.C. 154(b) by 311 days.

(21) Appl. No.: 15/491,054

(22) Filed: Apr. 19, 2017

(65) Prior Publication Data
US 2017/0338395 A1 Nov. 23, 2017

Related U.S. Application Data

(60) Provisional application No. 62/337,958, filed on May 18, 2016.

(51) Int. Cl.
*H01L 35/34* (2006.01)
*H01L 35/24* (2006.01)
(Continued)

(52) U.S. Cl.
CPC ............ *H01L 35/34* (2013.01); *C08J 9/0061* (2013.01); *C08J 9/28* (2013.01); *H01L 35/24* (2013.01);
(Continued)

(58) Field of Classification Search
CPC ...... H01L 35/34; H01L 35/24; C08J 9/00061; C08J 9/28; C08J 2205/022; C08J 2205/026; C08J 2201/0484
See application file for complete search history.

(56) References Cited

U.S. PATENT DOCUMENTS 5,973,015 A 10/1999 Coronado
6,004,436 A 12/1999 Ayers
(Continued)

OTHER PUBLICATIONS

Zhang et al, "Aligned/Unaligned Conducting Polymer Cryogels with Three-Dimensional Macroporous Architectures from Ice-Segregation-Induced Delf-Assembly of PEDOT:PSS", Langmuir, 27(5), Jan. 19, 2011, pp. 1915-1923.*
(Continued)

*Primary Examiner* — C Melissa Koslow (57) ABSTRACT

This disclosure provides systems, methods, and apparatus related to thermoelectric polymer aerogels. In one aspect, a method includes depositing a solution on a substrate. The solution comprises a thermoelectric polymer. Solvent of the solution is removed to form a layer of the thermoelectric polymer. The layer is placed in a polar solvent to form a gel comprising the thermoelectric polymer. The gel is cooled to freeze the polar solvent. The gel is placed in a vacuum environment to sublimate the polar solvent from the gel to form an aerogel comprising the thermoelectric polymer.

17 Claims, 6 Drawing Sheets

(51) Int. Cl.
*C08J 9/00* (2006.01)
*C08J 9/28* (2006.01)

(52) U.S. Cl.
CPC .. *C08J 2201/0484* (2013.01); *C08J 2205/022* (2013.01); *C08J 2325/18* (2013.01); *C08J 2425/18* (2013.01); *C08J 2465/00* (2013.01)

(56) References Cited

U.S. PATENT DOCUMENTS

| | | |
|---|---|---|
| 6,005,012 A | 12/1999 | Hrubesh |
| 6,087,407 A | 7/2000 | Coronado |
| 8,552,076 B2 | 10/2013 | Cho |

OTHER PUBLICATIONS

Starbird et al, "Synthesis of an organic conductive porous material using strach aerogels as template for chronic invasive electrodes", Materials Science and Engineering C, 37, Jan. 7, 2014, pp. 177-183.*

Khan et al, "Thermoelectric Polymers and their Elastic Aerogels", Advanced Materials, 2016, 28, Feb. 2, 2016, pp. 4556-4562.*

Massonnet, N., et al. "Improvement of the Seebeck coefficient of PEDOT:PSS by chemical reduction combined with a novel method for its transfer using free-standing thin films" J. Mater. Chem. C 2014, 2, 1278.

Khan, Z. U., et al. "Thermoelectric Polymers and their Elastic Aerogels" Adv. Mater. 2016, 28, 4556.

Bubnova, O., et al. "Optimization of the thermoelectric figure of merit in the conducting polymer poly(3,4-ethylenedioxythiophene)" Nat. Mater. 2011, 10, 429.

Zhang, B., et al. "Promising Thermoelectric Properties of Commercial PEDOT:PSS Materials and Their Bi2Te3 Powder Composites" ACS Appl. Mater. Interfaces 2010, 2, 3170.

Yue, R.; Xu, J. "Poly(3,4-ethylenedioxythiophene) as promising organic thermoelectric materials: A mini-review" Synth. Met. 2012, 162, 912.

Wang, J., et al. "Enhanced thermoelectric properties of poly(3,4-ethylenedioxythiophene) thin films treated with H2SO4" Org. Electron. 2014, 15, 3087.

Ouyang, J., et al. "On the mechanism of conductivity enhancement in poly(3,4-ethylenedioxythiophene):poly(styrene sulfonate) film through solvent treatment" Polymer 2004, 45, 8443.

Wei, Q., et al. "Morphological Change and Mobility Enhancement in PEDOT:PSS by Adding Co-solvents" Adv. Mater. 2013, 25, 2831.

Takano, T., et al. "PEDOT Nanocrystal in Highly Conductive PEDOT:PSS Polymer Films" Macromolecules 2012, 45, 3859.

Luo, J., et al. "Enhancement of the thermoelectric properties of PEDOT:PSS thin films by post-treatment" J. Mater. Chem. A 2013, 1, 7576.

Shi, H., et al. "Effective Approaches to Improve the Electrical Conductivity of PEDOT:PSS: A Review" Adv. Electron. Mater. 2015, 1, 7.

Winther-Jensen, B.; West, K. "Vapor-Phase Polymerization of 3,4-Ethylenedioxythiophene: A Route to Highly Conducting Polymer Surface Layers" Macromolecules 2004, 37, 4538.

Kim, G. H., et al. "Engineered doping of organic semiconductors for enhanced thermoelectric efficiency" Nat. Mater. 2013, 12, 719.

Zhang, X., et al. "Conducting polymer aerogels from supercritical CO2 drying PEDOT-PSS hydrogels" J. Mater. Chem. 2010, 20, 5080.

Kim, Y. H., et al. "Highly Conductive PEDOT:PSS Electrode with Optimized Solvent and Thermal Post-Treatment for ITO-Free Organic Solar Cells" Adv. Funct. Mater. 2011, 21, 1076.

Teng, C., et al. "Polymer in situ embedding for highly flexible, stretchable and water stable PEDOT:PSS composite conductors" RSC Adv. 2013, 3, 7219.

Jonsson, S. K. M., et al. "The effects of solvents on the morphology and sheet resistance in poly(3,4-ethylenedioxythiophene)-polystyrenesulfonic acid (PEDOT-PSS) films" Synth. Met. 2003, 139, 1.

Kim, J. Y., et al. "Enhancement of electrical conductivity of poly(3,4-ethylenedioxythiophene)/poly(4-styrenesulfonate) by a change of solvents" Synth. Met. 2002, 126, 311.

Crispin, X., et al. "The Origin of the High Conductivity of Poly(3,4-ethylenedioxythiophene)-Poly(styrenesulfonate) (PEDOT-PSS) Plastic Electrodes" Chem. Mat. 2006, 18, 4354.

Gordon, M.P., et al. "Soft PEDOT:PSS aerogel architectures for thermoelectric applications" J. Appl. Polym. Sci., 134, 44070.

* cited by examiner

THERMOELECTRIC POLYMER AEROGELS AND METHODS OF FABRICATION THEREOF

RELATED APPLICATIONS

This application claims priority to U.S. Provisional Patent Application No. 62/337,958, filed May 18, 2016, which is herein incorporated by reference.

STATEMENT OF GOVERNMENT SUPPORT

This invention was made with government support under Contract No. DE-AC02-05CH11231 awarded by the U.S. Department of Energy. The government has certain rights in this invention.

TECHNICAL FIELD

This disclosure relates generally to thermoelectric materials and more particularly to thermoelectric polymer aerogels.

BACKGROUND

Soft thermoelectrics provide the unique opportunity to combine traditional thermoelectric energy generation with inexpensive processing methods, tunable chemistries, and flexible form factors, opening the door to previously unattainable device architectures and applications. Traditional inorganic thermoelectrics are restricted by rigid geometries and use of expensive components with low earth abundance. The performance of thermoelectric materials is commonly characterized by a dimensionless figure of merit $ZT=S2\sigma T/\kappa$. For a given temperature T, this figure of merit depends on three material properties: the Seebeck coefficient S, electrical conductivity $\sigma$, and thermal conductivity $\kappa$, which are inherently coupled in band conduction materials, limiting optimization.

In contrast, organic and organic—inorganic composite thermoelectrics possess both inherently low thermal conductivities and unique thermal and electrical transport mechanisms, attributes which enable new strategies to break traditional performance optimization boundaries. Recent progress on soft thermoelectrics has been rapid, and performance of these materials is approaching that of traditional inorganics. However, the advantages of soft thermoelectrics extends beyond electronic properties—by leveraging tunable form factors along with these striking performance gains, researchers have successfully provided proof of principle for novel thermoelectric device architectures such as flexible modules and wearable thermoelectric fabrics. Morphological and architectural control over these materials provides another crucial mechanism for controlling transport in soft materials and invites new possibilities for reimagining soft thermoelectric applications.

SUMMARY

One innovative aspect of the subject matter described in this disclosure can be implemented in a method including depositing a solution on a substrate. The solution comprises a thermoelectric polymer. Solvent of the solution is removed to form a layer of the thermoelectric polymer. The layer is placed in a polar solvent to form a gel comprising the thermoelectric polymer. The gel is cooled to freeze the polar solvent. The gel is placed in a vacuum environment to sublimate the polar solvent from the gel to form an aerogel comprising the thermoelectric polymer.

Another innovative aspect of the subject matter described in this disclosure can be implemented in an aerogel, the aerogel including a thermoelectric polymer, the aerogel not including a cross-linking agent.

Also described herein is the characterization of pure PEDOT:PSS aerogels fabricated via a freeze-drying technique using no additional crosslinking agents. It is demonstrated that these materials provide a promising path to new classes of polymeric thermoelectric materials. The morphology, chemical composition, and thermoelectric properties of these robust and mechanically stable aerogels were investigated upon treatment with ethylene glycol. By direct comparison to fully dense PEDOT:PSS thick films, it is shown that the electronic portion of thermoelectric transport in PEDOT:PSS was remarkably unaffected by morphological porosity, presenting opportunities for novel soft materials that simultaneously integrate thermoelectric behavior while also capitalizing on the high surface area scaffolding accessible in such aerogel architectures.

Details of one or more embodiments of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIGS. 3A-3D shows examples of SEM images documenting the structural and morphological differences between PEDOT:PSS aerogels and thick films.

FIGS. 4A-4F show the SEM characterization of the structural evolution effects on PEDOT:PSS aerogels of co-solvent treatment.

FIGS. 5A-5C show examples of S(2p) XPS spectra of PEDOT:PSS aerogels that reveal a high degree of compositional heterogeneity, indicating the formation of segregated polymeric domains during aerogel formation. FIGS.

5A and 5B show S(2p) XPS spectra of two different spots on the surface of the same aerogel sample.

FIGS. 6A-6C show examples of the results of thermoelectric measurements of both PEDOT:PSS aerogels and thick films.

DETAILED DESCRIPTION

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

In the following description, numerous specific details are set forth in order to provide a thorough understanding of the present invention. Particular example embodiments of the present invention may be implemented without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise.

The terms "about" or "approximate" and the like are synonymous and are used to indicate that the value modified by the term has an understood range associated with it, where the range can be ±20%, ±15%, ±10%, ±5%, or ±1%. The term "substantially" is used to indicate that a value is close to a targeted value, where close can mean, for example, the value is within 80% of the targeted value, within 90% of the targeted value, within 95% of the targeted value, or within 99% of the targeted value.

One thermoelectric material architecture of particular interest is a highly porous aerogel composed of electronically conductive soft material, which is particularly appealing for applications reliant upon large accessible surface areas. For example, conductive polymers have been previously explored for chemical sensors and artificial muscles, both of which rely on the presence of functional surface area. Likewise, aerogel composites using conductive polymers and nanocellulose or carbon nanotubes have been studied as capacitor electrodes. Another advantage of aerogels originates from their high void volume; they are volumetrically composed largely of air and are thus exceptional thermal insulators and even fire-retardant. Moreover, constructing aerogels from polymeric materials introduces a novel possibility to have mechanically labile aerogels, in contrast to most inorganic aerogels, which are brittle. Further, morphology also strongly impacts thermal conductivity in soft materials; contrary to the notion that thermal conductivity is more or less constant and low for all organic materials, the thermal conductivity of organic materials has been shown to range over several orders of magnitude, from around 0.3 W/m K for amorphous organic material to 30 W/m K for aligned polymeric fibers. Morphological control is thus a critical characteristic for controlling thermal transport in soft thermoelectrics. Moreover, the most easily employed methods for measurement of thermal conductivity ($3\omega$ and time domain thermal reflectance) both measure through-plane conductivity. Many conductive polymers are known to have a large degree of anisotropy, pointing to even greater in-plane thermal conductivities. Aerogels, on the other hand, provide a path for minimizing the thermal conductivities of high performing organic thermoelectric materials by tuning the form factor.

The variety of electronically conductive polymers and small molecules being investigated for thermoelectric applications is quickly growing. Among these materials, poly(3,4-ethylenedioxythiophene):poly(4-styrenesulfonate) (PEDOT:PSS) has emerged as one of the most widely studied and highest performing organic thermoelectric materials. The electronic conductivity of PEDOT-based materials has been shown to range dramatically from 0.1 S/cm up to as high as 1750 S/cm. This trend has been closely tied to solvent effects, hypothesized to drive molecular conformational changes in PEDOT-based films leading to increases in PEDOT inter-chain interactions in a manner consistent with enhanced crystalline ordering of PEDOT domains. Therefore, control over morphology and polymeric structuring in these materials is key to tuning electronic transport in PEDOT-based thermoelectrics, highlighting the opportunities for novel, high-performing device architectures.

PEDOT is a p-type polymer based on the ethylenedioxythophene (EDOT) monomer, typically synthesized via oxidative polymerization in the presence of an acidic polyelectrolyte that doubles as a doping agent. For example, the most commonly used polyelectrolyte in this process is polystyrenesulfonic acid (PSS), which is used to form the aqueous PEDOT:PSS dispersions that are commercially available. Other PEDOT-based variants have been synthesized, such as PEDOT:Tos, formed using Fe(III) tris-p-toluenesulphonate (Tos). PEDOT:PSS and PEDOT:Tos have been demonstrated to have remarkable thermoelectric properties, due to enhanced charge delocalization across crystalline PEDOT domains to even the extent of realizing semimetallic transport. PEDOT:PSS films have been studied for a wide variety of applications, including anti-static coatings, thermoelectrics, touchscreen coatings, organic LEDs, and organic solar cells. The majority of work on PEDOT:PSS focuses on manipulating the oxidation state, chemical composition, and doping environment in PEDOT:PSS thin films, by which remarkable thermoelectric performance has been demonstrated. For example, by adding small amounts (~5%) of ethylene glycol, power factors as high as 469 $\mu$W/m K$^2$ (ZT=0.4) have been reported. These performance gains have also been tied to selective removal of excess PSS, a claim which is supported by observation of (1) film thickness, (2) IR/optical absorption spectroscopy, and (3) XPS chemical analysis of films before and after solvent treatment. While IR/optical absorption data lends insight into bulk chemical properties of the films, XPS only probes the top 10 nm of the films' surfaces and must be carefully considered before drawing conclusions about bulk chemical compositions. Excess PSS is used in commercial PEDOT:PSS products to produce a stable dispersion in water. However, it is believed that the excess PSS forms electronically insulating domains in PEDOT:PSS films, through which charge carriers must tunnel in order to transport between the crystalline, conductive PEDOT domains. Understanding the effects of solvent treatment on composition and molecular morphology in PEDOT:PSS and the corresponding effects on thermoelectric properties is an active area of interest, and is highly relevant to studies of alternative device architectures as well.

Despite extensive research into PEDOT-based materials, few studies have focused on fabrication and systematic characterization of high performing thermoelectric materials with novel architectures. In one study, Massonnet et al. achieved remarkable Seebeck coefficients in freestanding thick films of PEDOT:PSS. In other work, PEDOT:PSS aerogels have been synthesized, although typically these preparatory methods involve the use of additional crosslinking agents, which adds additional processing steps and variables complicating transport analysis. For example, Luo et al. have reported making aerogel structures from PEDOT:PSS dispersions via two-step process: (1) formation of a hydrogel by crosslinking the ionic PEDOT:PSS network using Fe ions followed by, (2) supercritical $CO_2$ drying to remove the water from the hydrogel network. However, use of metal ions increases complexity and convolutes transport dynamics—these ions cannot be removed completely and introduce strong new scattering centers. Additionally, supercritical $CO_2$ drying involves high pressures and increases cost and difficulty of processing. Recently, it has been shown that PEDOT:PSS aerogels can be fabricated via freeze-drying of PEDOT:PSS dispersions. Most studies, thus far have focused on composite aerogels fabricated using a blend of PEDOT:PSS and other material, such as nanocellulose, carbon nanotubes, and polydimethylsiloxane (PDMS) in an effort to synergize the high electrical conductivity of PEDOT:PSS with favorable characteristics of blend-in materials. However, in order to enable true rational design of such aerogel nanocomposites, there must first be a full characterization of the starting materials themselves—aerogels fabricated solely from PEDOT:PSS.

Figure 1:
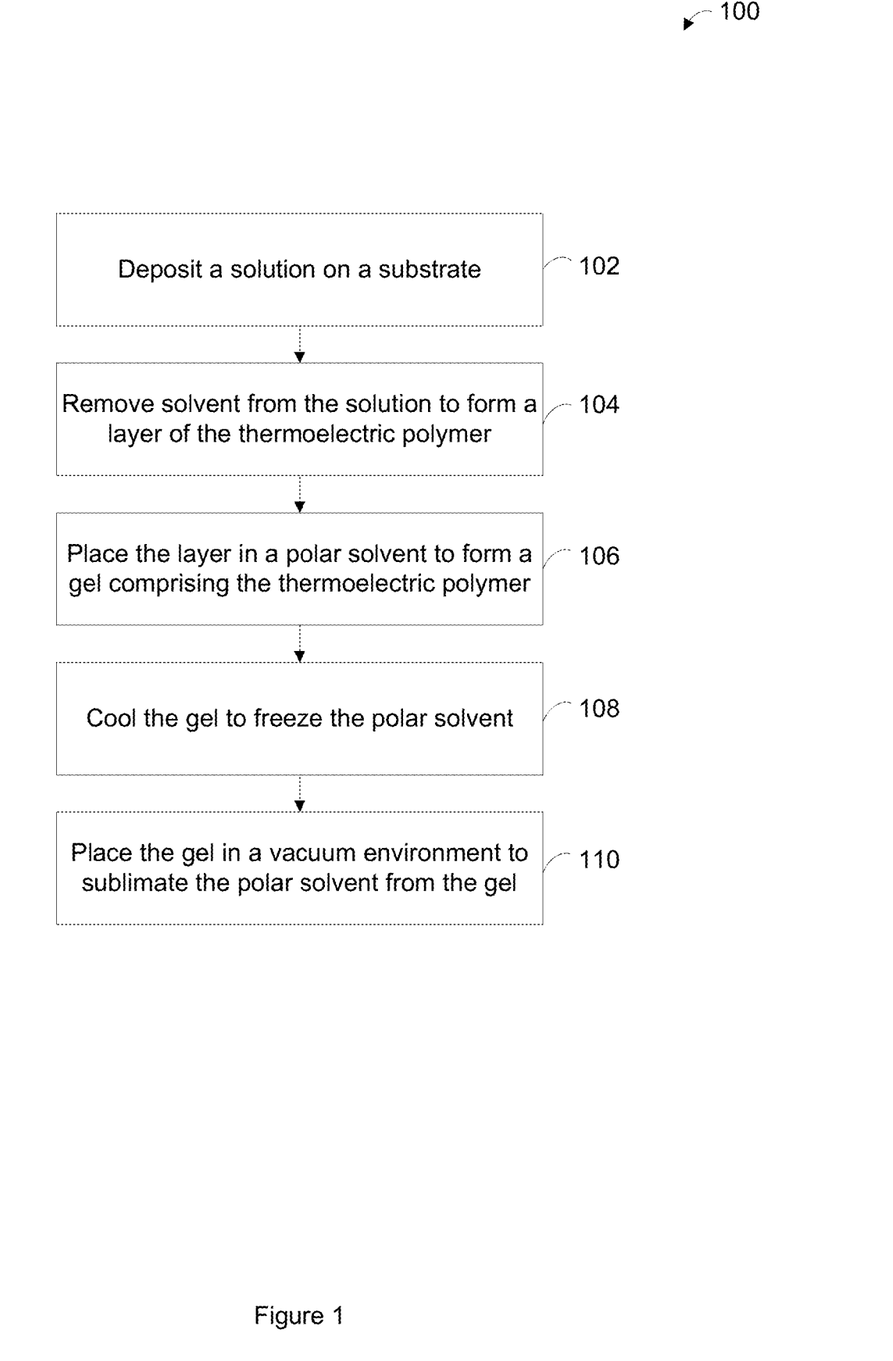
FIG. 1 shows an example of a flow diagram illustrating a manufacturing process for a thermoelectric polymer aerogel.
Figure 2:
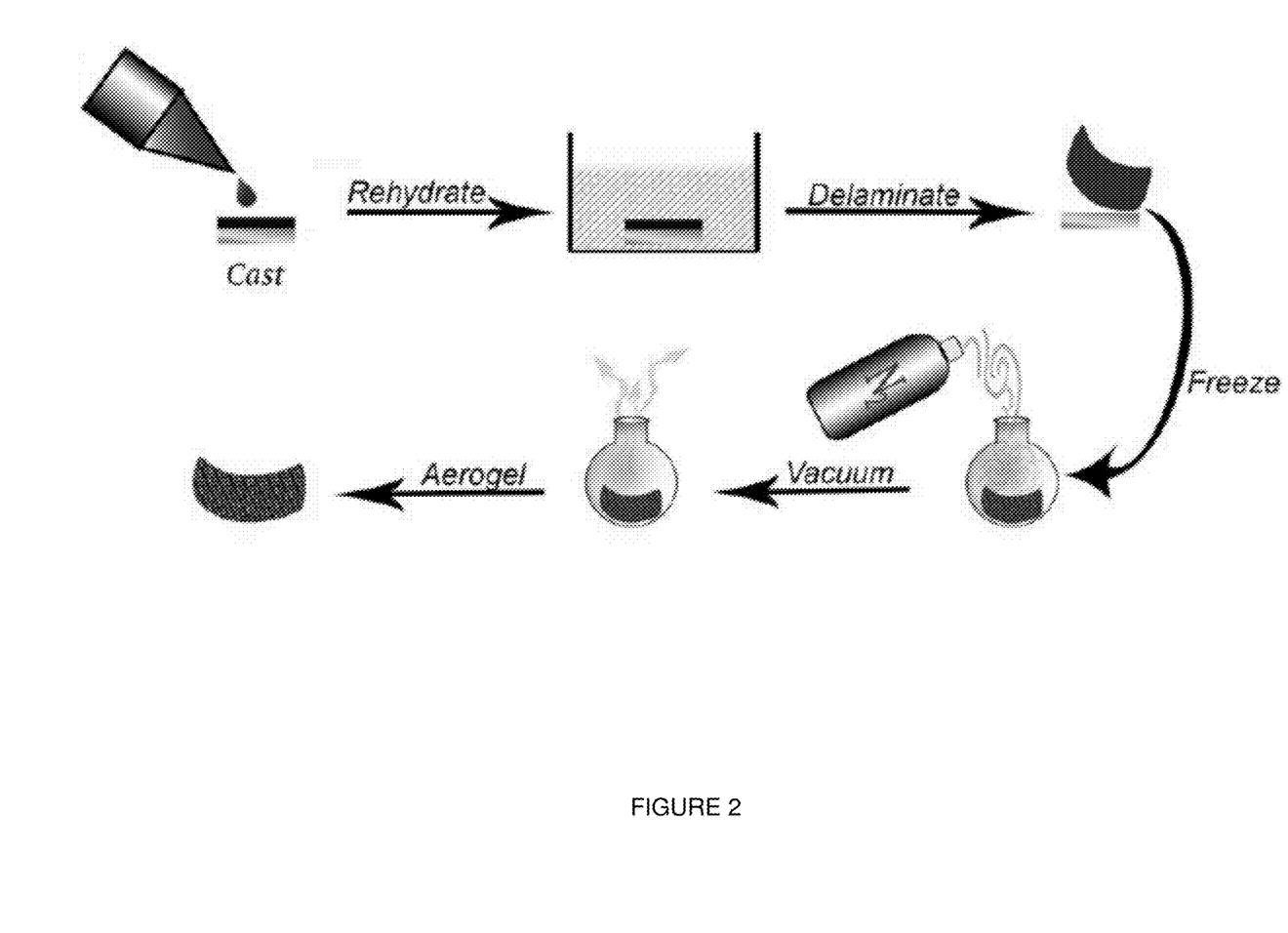
FIG. 2 shows examples of illustrations of the operations set forth in FIG. 1 and the claims.
Figure 3A:
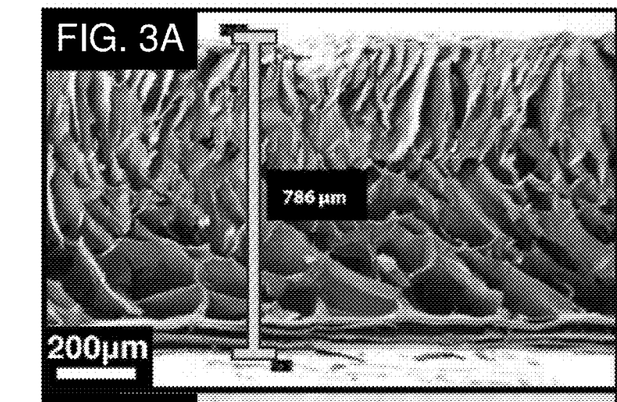
FIG. 3A shows an example of a cross-sectional image that demonstrates both the increased thickness and the finely structured porosity of the aerogel.
Figure 3B:
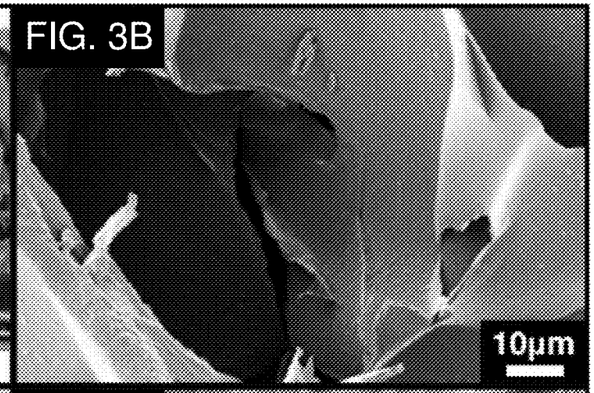
FIG. 3B shows an example of an increased magnification image on cross-sectional porous structure of the aerogel.
Figure 3C:
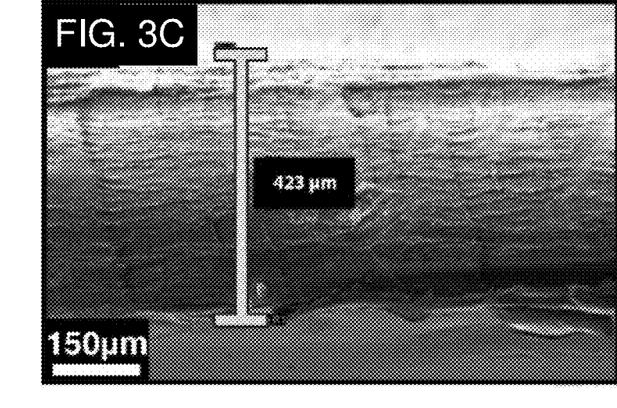
FIG. 3C shows an example of a cross-sectional image of the PEDOT:PSS thick film; the width is approximately half that of the aerogel.
Figure 3D:
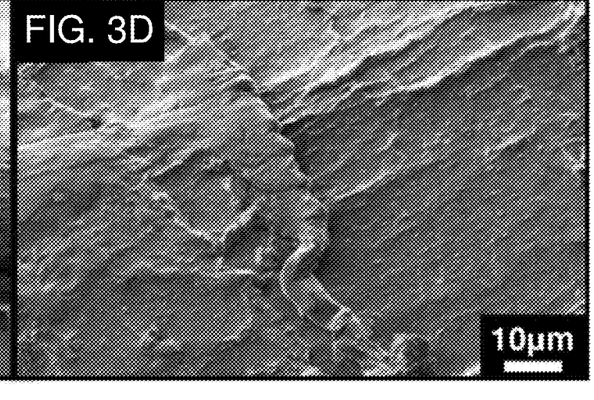
FIG. 3D shows an example of a magnified cross-sectional image that shows a lack of porous structure in the thick film.
Figure 4A:
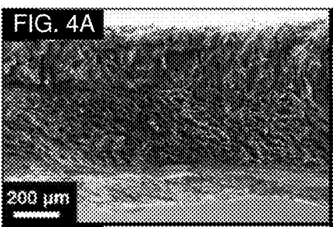
FIG. 4A shows an example of an image of an aerogel with no ethylene glycol or ethanol treatment.
Figure 4B:
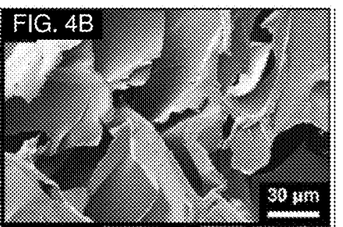
FIG. 4B shows an example of a magnified image of the porous structure of untreated aerogel.
Figure 4C:
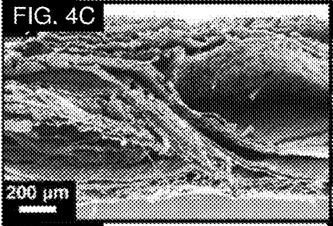
FIG. 4C shows an example of an image of an aerogel treated for 20 minutes with ethylene glycol and 30 minutes with ethanol.
Figure 4D:
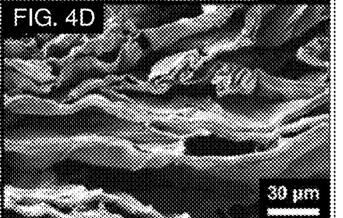
FIG. 4D shows an example of a magnified cross-sectional image of FIG. 4C that illustrates the collapse of aerogel pores resulting from solvent treatment.
Figure 4E:
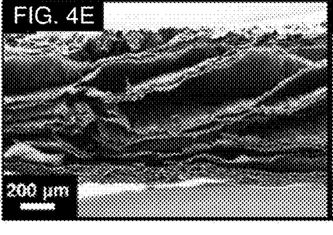
FIG. 4E shows an example of an image of an aerogel treated for 30 minutes with ethylene glycol and 30 minutes with ethanol.
Figure 4F:
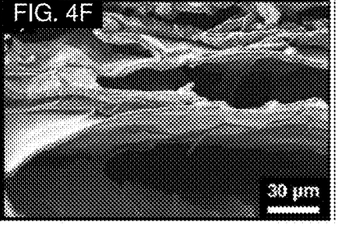
FIG. 4F shows an example of a magnified image of FIG. 4E that shows the further collapse of the micro porous structure into a layered type morphological array.

FIG. 1 shows an example of a flow diagram illustrating a manufacturing process for a thermoelectric polymer aerogel. FIG. 2 shows examples of illustrations of the operations set forth in FIG. 1 and the claims. The gel formed in the illustrations in FIG. 2 in the process of forming an aerogel is a hydrogel Starting at block 102 of the method 100 shown in FIG. 1, a solution is deposited on a substrate. The solution comprises a thermoelectric polymer and a solvent. In some embodiments, the solution consists of a thermoelectric polymer and a solvent. As used herein, a thermoelectric polymer includes polymer systems including one polymer or two or more different polymers, with the polymer or polymers exhibiting favorable thermoelectric properties.

In some embodiments, the thermoelectric polymer comprises two different polymers or a blend of two different polymers—one polymer that is immiscible in a solvent of the solution (e.g., hydrophobic when the solvent is water), and one polymer that is miscible in the solvent of the solution (e.g., hydrophilic when the solvent is water). The hydrophilic polymer may form a type of micelle structure that allows the hydrophobic polymer to go into solution. In some embodiments, the solvent of the solution comprises a polar solvent. In some embodiments, the solvent of the solution comprises water or an alcohol (e.g., ethanol, methanol). In some embodiments, the solvent of the solution comprises acetone, dimethylformamide, or dimethyl sulfoxide.

In some embodiments, the thermoelectric polymer is selected from a group consisting of poly(3,4-ethylenedioxythiophene):poly(4-styrenesulfonate) (PEDOT:PSS) and poly (3,4-ethylenedioxythiophene):tris-p-toluenesulphonate (PEDOT:Tos). In some embodiments, the thermoelectric polymer consists of poly(3,4-ethylenedioxythiophene):poly (4-styrenesulfonate) (PEDOT:PSS) or poly(3,4-ethylenedioxythiophene):tris-p-toluenesulphonate (PEDOT:Tos). In both of these thermoelectric polymers, PEDOT is immiscible in water and PSS and Tos are miscible in water. When the thermoelectric polymer comprises PEDOT:PSS, the mass ratio of the PEDOT to PSS may be about 1 to 2.5 by weight. In some embodiments, the mass ratio of a polymer immiscible in water to a polymer miscible in water is about 1 to 2.5 by weight. In some embodiments, the solution has a solid content of about 0.5% to 25%, about 0.5% to 3%, or about 1.0% to 1.3% of the thermoelectric polymer in the solvent.

In some embodiments, the substrate comprises a glass substrate or a silicon substrate. In some embodiments, a surface onto which the solution is deposited is a flat surface. In some embodiments, instead of using a substrate, the solution is deposited in a pan or a Petri dish-type structure.

In some embodiments, the solution further comprises an additive. Additives may include salts, ion-exchange resins, nanoparticles (e.g., nanowires, such as tellurium nanowires or nanoparticles, such as polystyrene or functionalized polystyrene beads), and small molecules (e.g. hydrazine, 2,3,5,6-tetrafluoro-7,7,8,8-tetracyanoquinodimethane, and tetrakis(dimethylamino)ethylene). Such additives may alter the properties of the aerogel that is formed.

At block 104, solvent of the solution is removed to form a layer of the thermoelectric polymer. In some embodiments, the solvent of the solution is removed by evaporation. For example, in some embodiments, removing the solvent of the solution comprises heating the substrate and the solution disposed thereon to a temperature, with the temperature being below the boiling point of the solvent. For example, the substrate and the solution disposed thereon may be heated by placing the substrate on a hot plate or by placing the substrate in an oven or a furnace. When the solvent comprises water, the substrate may be heated to about 70° C. to 90° C., or about 80° C., to evaporate the water. In some embodiments, the layer has a thickness of about 200 microns to 2 millimeters (mm), about 250 microns to 750 microns, or about 500 microns.

In some embodiments, removing the solvent of the solution at block 104 occurs over a time period of about 4 hours to 20 hours, or about 16 hours. The time period in which the solvent is removed from the solution is determined in part by the temperature of the substrate and the solution and the amount of the solution. In some embodiments, removing the solvent of the solution over a period of time allows for two polymers comprising a thermoelectric polymer to rearrange or to change in configuration. The rearrangement of the two polymers may aid in allowing for the formation of a gel at block 106, instead of the thermoelectric polymer simply dissolving into solution in the polar solvent.

In some embodiments, when the solution includes an additive that has a higher density that than the solution (e.g., nanoparticles), the solution is stirred during block 104. Stirring the solution when removing the solvent from the solution may aid in preventing nanoparticles from settling to the bottom of the solution. This may aid in uniformly dispersing the nanoparticles throughout the layer and throughout the aerogel. For example, a first volume of the solution may be deposited on the substrate with the solution being stirred while removing the solvent. When at least some of the solvent has been removed, a second volume of the solution may be deposited on the substrate with the solution being stirred while removing the solvent. This may be repeated until a specified thickness of the layer is obtained.

At block 106, the layer is placed in a polar solvent to form a gel comprising the thermoelectric polymer and the polar solvent. In some embodiments, the layer is immersed in the polar solvent. A gel may be defined as a substantially dilute cross-linked system which exhibits no flow when in the steady-state (e.g., a semi-rigid structure). A gel may also be defined as a solid composed of at least two components, one of which (e.g., a polymer) forms a three-dimensional network by virtue of covalent or noncovalent bonding (i.e., chemical and physical gels, respectively) in the medium of the other component (e.g., a liquid). A minimum amount of the liquid is sufficient for ensuring the elastic properties of the gel.

During block 106, the layer increases in volume (i.e., it swells up). In some embodiments, the thermoelectric polymer does not dissolve in the polar solvent. In some embodiments, the solvent of the solution and the first polar solvent comprise the same solvent. In some embodiments, the solvent of the solution and the first polar solvent comprise different solvents. When the thermoelectric polymer comprises two different polymers (e.g., PEDOT and PSS), the two polymers may change in arrangement during block 104. This change in arrangement of the two different polymers may aid in preventing the thermoelectric polymer from dissolving in the polar solvent.

In some embodiments, the layer is placed or immersed in the polar solvent for about 1 minute to 30 minutes, or about 5 minutes. The amount of time that the layer is in contact with the polar solvent determines in part the amount that the layer increases in volume—contacting the layer in the polar solvent for a longer time will yield a larger increase in volume. The amount of increase in volume of the layer (and increase in the thickness of the layer) will in turn affect the thickness of the aerogel that is formed. When the polar solvent comprises water, the layer is rehydrated and the gel formed is a hydrogel. In some embodiments, the gel is removed from the substrate after block 106.

At block 108, the gel is cooled to freeze the polar solvent of the gel. For example, the gel may still include some of the polar solvent after the gel is removed from being placed or immersed in the polar solvent at block 106. The gel may be cooled by placing the gel in a refrigeration unit. The gel may also be cooled by contacting the gel with a cold liquid or immersing the gel in a cold liquid. An example of a cold liquid is liquid nitrogen. For example, when the gel is a hydrogel, the hydrogel is cooled to about 0° C. or lower to freeze the water. The hydrogel may be placed or immersed in liquid nitrogen to freeze the water of the hydrogel. In some embodiments, the cooling rate at block 108 is about 200° C. per minute (° C./minute) to 230° C./minute. Using a cooling rate that is sufficiently high may aid in persevering the configuration of two polymers comprising a thermoelectric polymer when the solvent is freezing. Too much rearrangement of the two polymers may lead to the formation of large domains of the first polymer and the second polymer and a loss of favorable electric properties of the thermoelectric aerogel.

At block 110, the gel is placed in a vacuum environment to sublimate the polar solvent from the gel. The gel is placed in the vacuum environment while the polar solvent is frozen or in a solid phase. Sublimation is the transition of a substance directly from the solid phase to the gas phase without passing through the intermediate liquid phase. Sublimating the polar solvent from the gel forms an aerogel comprising the thermoelectric polymer. An aerogel may be defined as a synthetic porous ultralight material derived from a gel in which the liquid component of the gel has been replaced with a gas (e.g., air). The vacuum environment may be formed by pulling a vacuum on a container, with the gel being placed in the container. In some embodiments, the vacuum environment includes a pressure or a vacuum of about 150 torr or lower.

In some embodiments, a crosslinking agent is not used the method 100 of forming an aerogel comprising a thermoelectric polymer. Crosslinking agents include metal ions (e.g., iron ions). The crosslinking agent may serve to bind the two polymers when the thermoelectric polymer comprises two polymers. Not using a crosslinking agent is one reason for the mechanical properties of the aerogels formed with the method 100 compared to other aerogels. In some embodiments, the aerogel does not include an additive that adds structural stability to the aerogel.

In some embodiments, the aerogel fabricated with the method 100 comprises a thermoelectric polymer. In some embodiments, the aerogel consists of a thermoelectric polymer. In some embodiments, the thermoelectric polymer comprises poly(3,4-ethylenedioxythiophene):poly(4-styrenesulfonate) (PEDOT:PSS) or poly(3,4-ethylenedioxythiophene):tris-p-toluenesulphonate (PEDOT:Tos). In some embodiments, the thermoelectric polymer is selected from a group consisting of poly(3,4-ethylenedioxythiophene):poly(4-styrenesulfonate) (PEDOT:PSS) and poly(3,4-ethylenedioxythiophene):tris-p-toluenesulphonate (PEDOT:Tos). In some embodiments, the aerogel does not include a crosslinking agent. In some embodiments, the aerogel has a thickness of about 500 microns to 10 centimeters or about 500 microns to 5 centimeters. In some embodiments, the aerogel is not brittle. For example, the aerogel may be bent past 90 degrees without fracturing.

The aerogel has a pore size. The sizes of pores in the aerogel may vary from about 1 micron to 15 microns. The pore size in the aerogel may be affected by additives to the solution used to form the layer at block 104. An aerogel generally may be taken to have pore sizes that are smaller than 100 nanometers (nm). The aerogels comprising a thermoelectric polymer described herein may have pore sizes that are larger than 100 nm (e.g., micron sized pores in an aerogel comprising a thermoelectric polymer).

In some embodiments, the method 100 includes operations after block 110. In some embodiments, the aerogel is placed or immersed in a treatment solvent. In some embodiments, the treatment solvent comprises ethylene glycol, sulfuric acid, dimethyl sulfoxide (DMSO), or an alcohol (e.g., ethanol or methanol). In some embodiments, the aerogel is contacted with the treatment solvent for about 5 minutes to 60 minutes or about 15 minutes to 45 minutes. The treatment solvent may preferentially remove or rearrange one of the polymers of the thermoelectric polymer when the thermoelectric polymer comprises two polymers. For example, for a PEDOT:PSS aerogel, ethylene glycol, dimethyl sulfoxide, or sulfuric acid may remove some of the PSS.

Further, in some embodiments, a polymer system that is not a thermoelectric polymer may be used to form an aerogel with the method 100. In some embodiments, the polymer system comprises two polymers or a blend of two polymers—one polymer that is immiscible in a solvent of the solution (e.g., hydrophobic when the solvent is water), and one polymer that is miscible in the solvent of the solution (e.g., hydrophilic when the solvent is water).

EXAMPLES

The following examples and experiments are intended to be examples of the embodiments disclosed herein, and are not intended to be limiting.

For generating the experimental results discussed below, PEDOT:PSS (mass ratio of 1:2.5 by weight with 1.0% to 1.3% solid content in water) was purchased. Fifty milliliters of PEDOT:PSS solution was evaporated in a flat-bottomed evaporating dish (90 mm×50 mm) with a 7.5 cm×5 cm glass substrate at the bottom. The solution was evaporated on top of a hot plate set at 80° C. overnight, after which the thick (~500 micron thick) dried film was removed from the glass substrate. Regularity of sample shape and size was achieved by cleaving individual samples from one large thick film. The freestanding thick films were cleaved into approximately 10 individual 1 cm×1 cm size squares. In this way, irregularly shaped samples could be discarded and edge effects avoided from drop casting.

Uncleaved large thick film samples were used as the starting point from which to prepare aerogel samples. The thick film was placed in a Pyrex beaker of 40 mL high purity deionized water for 5 minutes to form a hydrogel. The water in the beaker was poured off, leaving the hydrogel in a Pyrex beaker. This hydrogel was immersed in excess liquid nitrogen for approximately 1 minute to ensure all residual water in the hydrogel was frozen, then the sample was immediately placed under vacuum on a Schlenk line (~150 Torr) overnight. The vacuum in the Schlenk line was induced via a roughing pump. The dried aerogel was then cleaved into approximately 10 individual 1 cm×1 cm squares just as the thick film samples were. Sample shape irregularity and detrimental edge effects were avoided by utilizing this process.

PEDOT:PSS thick film and aerogel samples were prepared and treated with ethylene glycol for varying amounts of time. Triplicates of both films and foams in each treatment group were fabricated during each synthetic batch, and four synthetic batches were prepared to ensure reproducibility of results. Each sample was allowed to soak in ethylene glycol for varying amounts of time, ranging from 5 minutes to 30 minutes. After the necessary time had passed, the freestanding sample was moved into an ethanol bath in order to remove residual ethylene glycol from the sample. Once in the ethanol bath, the sample was rinsed and then left submerged in ethanol for 30 minutes. The sample was then heated at 45° C. for 5 minutes to remove any residual solvent. All samples were stored under vacuum to ensure all solvent was removed from the system and weighed before conducting any electrical measurements.

Previous attempts to produce PEDOT:PSS aerogels via freeze drying with no crosslinking agents produced brittle structures. However, the structures fabricated using the methods described above have some elasticity and are tolerant of moderate mechanical stress and manipulation. While the material demonstrates a flexible nature, it retains the familiar low density and light weight characteristics of classical aerogels.

SEM analysis revealed that the aerogels are made up of microscale, highly porous polymeric networks, in contrast to the dense solid nature of the thick film samples. It should be noted that both the thick film and aerogel samples in FIGS. 3A-3D contain roughly the same amount of PEDOT:PSS polymeric material and were synthesized in parallel using identical processing conditions. As a mechanism for this process, it is proposed that when a thick film of PEDOT:PSS is submerged in water, it forms an ionically crosslinked polymeric hydrogel network. Water is absorbed into the pores of this matrix due to the hydrophilicity of the PSS present, swelling the thick film to a larger volume. Formation of pores within this network is dictated by both ionic interactions between PEDOT and PSS chains and hydrophilic/hydrophobic interactions between the water and polymer chains. Subsequently, when the hydrogel is immersed in liquid nitrogen, the water flash freezes and ice crystals are grown within the pores of the hydrogel network. Finally, the frozen hydrogel is placed under sufficiently strong vacuum to promote sublimation of the ice crystals, preventing pore collapse and leaving behind a microporous network filled with air instead of water. In the past, supercritical $CO_2$ drying was used in the place of simple liquid nitrogen freeze-drying because it is known that the volume expansion during the water freezing process can rupture pores if the polymeric network is not sufficiently elastic. In this study, the formation of an intact microporous network in PEDOT:PSS aerogels after liquid nitrogen freeze-drying was observed, implying that the PEDOT:PSS network is elastic and mobile enough to accommodate the volume change during ice formation.

The aerogel samples were thicker than the thick films, indicating that the initially hydrated swollen polymeric network maintains pore volume as void space after freeze drying. The pores in the aerogel network appear to preferentially align in the same direction in certain regions, although there is large-scale heterogeneity in the arrangement. Through optimization of processing conditions, these techniques can create structures with highly aligned networks of pores.

Several reports have characterized the effects of solvent treatment using ethylene glycol on ultrathin films of PEDOT:PSS, but none so far have studied such effects on aerogels. In thin films, the extent of ethylene glycol doping is unclear and difficult to quantify. Here, the ratio of surface area to volume was maximized using aerogel architectures, providing the opportunity for maximum solvent penetration. To provide a comparison, both thick films and foams were treated with ethylene glycol for varying amounts of time using the same procedure. As mentioned before, previous studies have indicated that ethylene glycol treatment causes growth of PEDOT crystalline domains and selective removal of PSS from thin films of PEDOT:PSS. The aerogels used in this study are composed solely of PEDOT:PSS, so similar effects should be anticipated on the aerogels upon solvent treatment. In fact, the increased surface area in the aerogel structures may provide more active area for extraction of PSS, leading to the possibility of enhanced solvent effects. Aerogels treated with ethylene glycol for varying amounts of time show significant morphological changes, primarily at the microscale, as shown in FIGS. 4A-4F.

The first trend to note in FIGS. 4A-4F is that, as the aerogels are treated with ethylene glycol, there is a marked decrease in microscale features. After ethylene glycol treatment, there are fewer pores in the aerogel samples, and the pore walls become thicker and coarser. After a full 30 minutes of ethylene glycol treatment, the pore walls form long, sheet-like structures with a strong preference to align in a direction parallel to the top/bottom surface. An additional aspect of note is that the aerogel thicknesses do not appear to decrease significantly after ethylene glycol treatment. This is in direct contrast with thin film studies, in which the thinning of PEDOT:PSS films after solvent treatment was used as evidence for selective PSS removal.

XPS analysis was performed on PEDOT:PSS thick film and aerogel samples with varying ethylene glycol treatment times. Several scans (spot size=1 mm) were performed on each film at different locations to ensure representative spectra. Additionally, internal chemical analysis was performed by breaking a film or aerogel in half and performing cross-sectional XPS on the exposed area. All thick film samples demonstrated small variation in molar PSS to PEDOT ratio (this quantity is referred to as the S/T ratio herein) regardless of spot location. Considering the macroscale sampling nature of the X-ray beam spot size in these experiments (i.e., millimeters), the narrow distribution of S/T ratios observed suggests that gross variations in the concentration of PEDOT (T) and PSS (S)-rich domain at this length scale are not present in the thick films.

Consistent with previous reports, ethylene glycol treatment time was observed to be inversely correlated with S/T ratio in PEDOT:PSS films. In this case, a consistency between surface XPS and internal XPS of thick films was observed, indicating that the S/T ratios extracted from surface XPS are representative of the bulk S/T ratios in each sample. Chemical analysis indicated that the surfaces of PEDOT:PSS thick films after ethylene glycol treatment are indeed PSS deficient compared with pristine films and suggests that this is also the case internally.

Figure 5A:
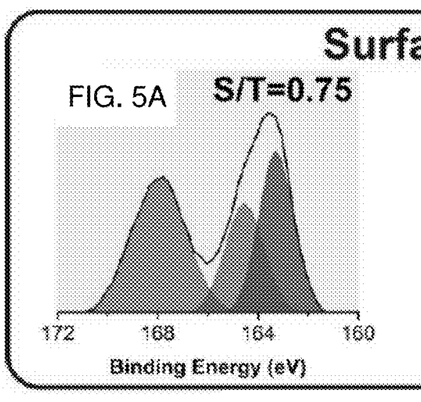
Figure 5B:
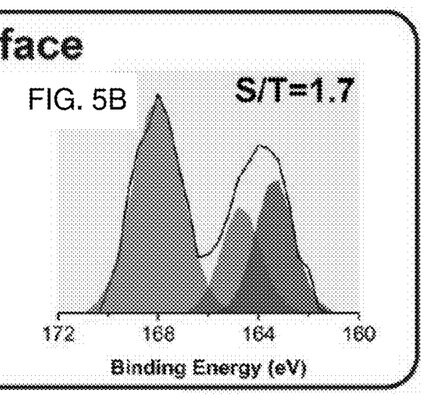
Figure 5C:
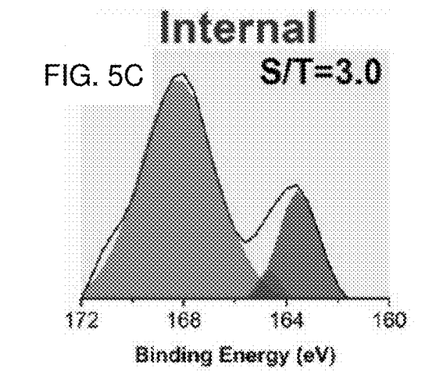
FIG. 5C shows a XPS spectra taken from the cross section of the aerogel indicates a drastically different polymer composition in the aerogel interior.

Interestingly, XPS analysis of aerogels revealed a markedly different distribution of PEDOT and PSS-rich domains than that observed in thick films. The XPS S(2p) spectra varied dramatically for each aerogel sample depending on the spot location. As a general trend, it was observed that the surface of these aerogels tended to be relatively PEDOT-rich, whereas the internal volume was PEDOT-poor. FIGS. 5A-5C show several representative spectra from the same aerogel sample. The S/T ratio extracted from these spectra varied between 0.75 and 1.7 on the surface of the aerogel, and was observed as high as 3.0 within the inner pores of the aerogel. Thus, even before any solvent treatment, large PEDOT-rich "hot spots" are observed on the surface of the aerogel.

Again considering the spot size of the X-ray, it was concluded that the length scale of PEDOT/PSS segregation must be much larger in the aerogels than in the films. This accounts for the wide distribution of S/T ratios extracted from different spots along the surface of the aerogels. It is proposed that this phenomenon is the result of reorganization of polymer chains during the aerogel synthesis process. Mechanistically, reorganization likely occurs during the rehydration step, during which the polymer chains are immersed in water and become mobile. PSS chains are soluble in water and present in excess (as mentioned before, the PEDOT:PSS ratio used was 1:2.5 by mass). Presumably, rehydration mobilizes excess PSS chains that are not active in stabilizing PEDOT domains, and drying directs redistribution of the polymer within the aerogel. As drying occurs from the surface inward, it is expected that the excess PSS would follow the water front into the inner volume of the aerogel and away from the surface. The result is a PSS-poor aerogel surface layer and PSS-rich core volume concurrent with larger-scale polymer segregation, consistent with the S/T ratios observed in experiment.

One important conclusion from this research is that while XPS provides an insightful probe for surface composition, further analysis is needed to understand bulk aerogel chemical composition. The large degree of heterogeneity in polymeric micro- and macro-structure exhibited by these materials renders it necessary to develop a new method for quantitation of bulk chemical composition.

Figure 6A:
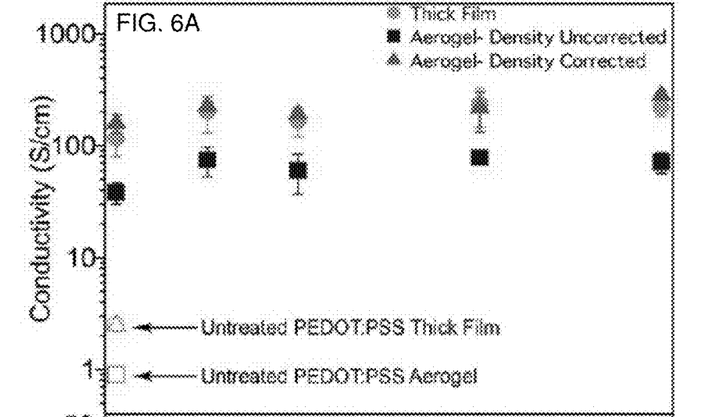
FIG. 6A shows the conductivity of both the aerogels and thick films show similar trends of increased conductivity based upon solvent treatment. After correcting for density differences between the thick films and aerogels, the conductivities are close in magnitude.
Figure 6B:
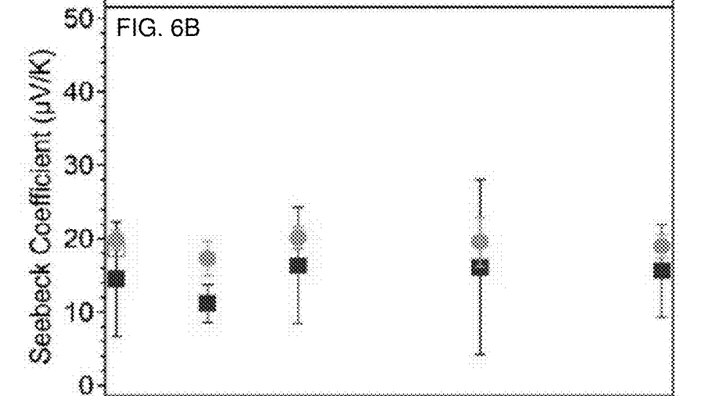
FIG. 6B shows that the Seebeck coefficient (thermopower) remains relatively constant regardless of solvent treatment.
Figure 6C:
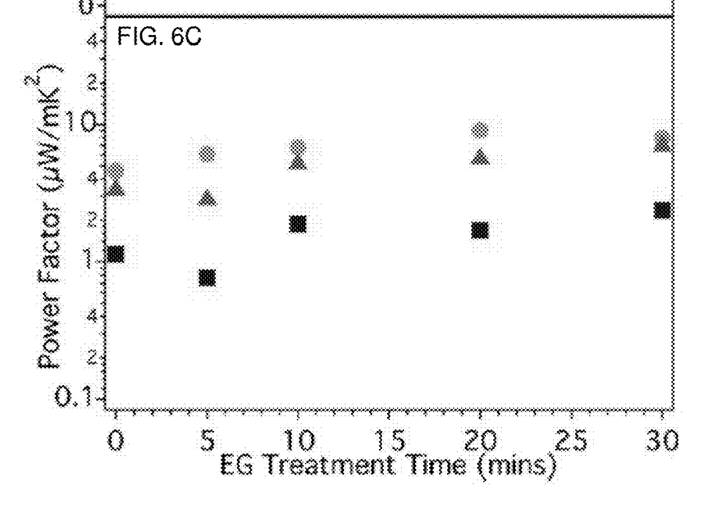
FIG. 6C shows that the power factors for thick films are two to four times greater than those for uncorrected aerogel samples.

The thermoelectric properties of PEDOT:PSS aerogels are shown in FIGS. 6A-6C. The electrical conductivities and Seebeck coefficients of the aerogels before and after solvent treatment are quite consistent to those of the thick films, demonstrating that PEDOT:PSS retains its thermoelectric performance even in this new aerogel geometry. Based on this result, it is proposed that the properties of PEDOT:PSS are relatively insensitive to the macroscale structure of the polymer.

As mentioned earlier, many reports have detailed the increase in conductivity of PEDOT:PSS thin films after solvent treatments. It is expected that aerogels should respond similarly to such solvent treatments. Electronic conductivity and Seebeck coefficients were measured for all thick film and aerogel samples after varying ethylene glycol treatment times, and the results are shown in FIGS. 6A and 6B. The initially measured electrical conductivities (labeled "Density Uncorrected" in FIG. 6A) show dampened electronic transport within the aerogel structure. However, the methodology used for extracting these values involves measurement of four-point probe resistances in the polymeric structures, followed by thickness normalization. This method is not appropriate for normalization of both thick film and aerogel conductivities because it neglects the fact that, for a given thickness, a dense film contains more material than a porous aerogel. To account for this effect, all conductivity values were additionally normalized by density, leading to "Density Corrected" electronic conductivity values reported in FIGS. 6A-6C and revealing that overall electronic transport is largely unchanged in the transition from thick film to aerogel structures. The aerogels exhibit similar power factors to the thick film samples, further supporting the hypothesis that the thermoelectric performance of PEDOT:PSS materials is insensitive to macroscale geometry.

Optimizing solvent treatment conditions for PEDOT:PSS is an involved process that depends on multiple parameters such as film thickness, choice of solvent, solvent concentrations, treatments time, etc. Crispin et al., report a conductivity increase from 0.006 to 10 S/cm, whereas more recent literature, Kim et al., reports PEDOT:PSS thin film conductivities up to 639 S/cm. Ultimately a 30 minute treatment duration time was chosen based upon the data presented by Kim et al. where the PEDOT:PSS thin films are treated for 30 minutes in order to garner optimal electrical properties. The aerogel architecture is significantly different from thin films—these aerogels average about 500 microns thick and their microstructure is locally stochastic—hence one would not expect the optimal solvent treatments for aerogels and thin films to be identical. However, based on the analogous enhancement in electrical conductivity post-treatment in both thin film and aerogel architectures, it is concluded that thermoelectric properties can be further optimized in PEDOT:PSS aerogels using established optimization methods.

As expected, both the thick film and aerogel samples responded to solvent treatments in a similar manner to what is reported in thin films. The electronic conductivity increased by greater than an order of magnitude, even at short solvent treatment times, and plateaued at some maximum value. Extending the conclusions of previous thin film work, it is expected that the solvent treatment preferentially removes PSS from the thick films and aerogels, reducing the amount of insulating material present and enabling increased carrier mobility within the material. This conclusion is further supported by SEM and XPS characterization—the aerogels underwent a morphological and structural transition during solvent treatment. The reduction in microscale features observed via SEM points to either a change in chemical composition or polymeric chain ordering within the aerogel structures. Additionally, the aerogel Seebeck coefficient is invariant in regards to ethylene glycol treatment time, which corroborates the hypothesis that solvent treatment causes a structural change in the polymer network, as opposed to a change in the number of carriers in the system.

As described above, a freeze-drying technique was used to fabricate PEDOT:PSS aerogels with consistent structure, geometry, and mechanical stability. This allowed for the first systematic report of pure PEDOT:PSS aerogel thermoelectric properties. These aerogels demonstrated a microscale porous network with high surface area. XPS revealed that a high degree of polymeric restructuring occurs during the aerogel synthesis process, leading to the emergence of large-scale PEDOT-rich domains on the surface. Ethylene glycol treatment was shown to provide an order of magnitude enhancement in electrical conductivity of these aerogels while leaving thermopower unchanged, consistent with the effects of solvent treatment of PEDOT:PSS in film geometries. Simultaneous to this conductivity enhancement, the aerogels underwent a morphological transition characterized by loss of microscale features and thickening of pore walls. Nevertheless, these materials exhibited high thermoelectric performance for a purely organic aerogel material, achieving power factors as high as 6.8 $\mu W/mK^2$. Particularly striking was that the performance of the aerogels was nearly identical to freestanding thick films synthesized in parallel—the high-performing thermoelectric nature of PEDOT:PSS is insensitive to macroscale structure of the polymeric material.

CONCLUSION

Further details regarding the embodiments described herein can be found in Gordon, M. P., Zaia, E. W., Zhou, P., Russ, B., Coates, N. E., Sahu, A. and Urban, J. J. (2016), Soft PEDOT:PSS aerogel architectures for thermoelectric applications, J. Appl. Polym. Sci., 134, 44070, which is herein incorporated by reference.

In the foregoing specification, the invention has been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

What is claimed is:

1. A method comprising:
    (a) depositing a solution on a substrate, the solution comprising a thermoelectric polymer;
    (b) removing solvent of the solution to form a layer of the thermoelectric polymer;
    (c) placing the layer in a polar solvent to form a gel comprising the thermoelectric polymer;
    (d) cooling the gel to freeze the polar solvent; and
    (e) placing the gel in a vacuum environment to sublimate the polar solvent from the gel, forming an aerogel comprising the thermoelectric polymer.

2. The method of claim 1, wherein the thermoelectric polymer comprises a first polymer and a second polymer, wherein the first polymer is miscible in the solvent, and wherein the second polymer is immiscible in the solvent.

3. The method of claim 1, wherein the thermoelectric polymer is selected from a group consisting of poly(3,4-ethylenedioxythiophene):poly(4-styrenesulfonate) (PEDOT:PSS) and poly(3,4-ethylenedioxythiophene):tris-p-toluenesulphonate (PEDOT:Tos).

4. The method of claim 1, wherein the solution has a solid content of about 0.5% to 25% of the thermoelectric polymer in the solvent.

5. The method of claim 1, wherein the layer has a thickness of about 200 microns to 2 millimeters.

6. The method of claim 1, wherein removing the solvent of the solution comprises heating the substrate and the solution disposed thereon to a temperature, and wherein the temperature is below the boiling point of the solvent.

7. The method of claim 1, wherein the polar solvent comprises water, and wherein the gel is a hydrogel.

8. The method of claim 1, wherein the layer is placed in the polar solvent for about 1 minute to 30 minutes in operation (c).

9. The method of claim 1, further comprising:
    after operation (c), removing the gel from the substrate.

10. The method of claim 1, wherein the rate of cooling in operation (d) is about 200° C./minute to 230° C./minute.

11. The method of claim 1, wherein the polar solvent comprises water, wherein the gel is a hydrogel, and wherein the hydrogel is cooled to about 0° C. or lower to freeze the water of the gel in operation (d).

12. The method of claim 11, wherein operation (d) is performed by placing the hydrogel in liquid nitrogen.

13. The method of claim 1, wherein the vacuum environment includes a vacuum of about 150 torr or lower.

14. The method of claim 1, wherein a crosslinking agent is not used in the method.

15. The method of claim 1, further comprising:
    after operation (e), placing the aerogel in a treatment solvent, wherein the treatment solvent is selected from a group consisting of ethylene glycol, sulfuric acid, dimethyl sulfoxide (DMSO), and an alcohol.

16. The method of claim 15, wherein the aerogel is placed in the treatment solvent for about 5 minutes to 60 minutes.

17. The method of claim 1, wherein the aerogel has a thickness of about 500 microns to 10 centimeters.

* * * * *